(12) United States Patent
Kauzlarich et al.

(10) Patent No.: US 7,267,721 B2
(45) Date of Patent: Sep. 11, 2007

(54) METHOD FOR PREPARING GROUP IV NANOCRYSTALS WITH CHEMICALLY ACCESSIBLE SURFACES

(75) Inventors: Susan M. Kauzlarich, Davis, CA (US); Richard K. Baldwin, San Diego, CA (US)

(73) Assignee: Evergreen Solar, Inc., Marlboro, MA (US)

( * ) Notice: Subject to any disclaimer, the term of this patent is extended or adjusted under 35 U.S.C. 154(b) by 397 days.

(21) Appl. No.: 10/900,965

(22) Filed: Jul. 28, 2004

(65) Prior Publication Data

US 2005/0070106 A1 Mar. 31, 2005

Related U.S. Application Data

(63) Continuation-in-part of application No. 10/247,757, filed on Sep. 19, 2002, now Pat. No. 6,855,204.

(60) Provisional application No. 60/323,285, filed on Sep. 19, 2001.

(51) Int. Cl.
*C30B 29/08* (2006.01)

(52) U.S. Cl. .............................. 117/68; 117/75; 117/77; 117/78; 117/936

(58) Field of Classification Search .................. 117/68, 117/75, 77, 78, 936
See application file for complete search history.

(56) References Cited

U.S. PATENT DOCUMENTS

| | | |
|---|---|---|
| 4,594,229 A | 6/1986 | Ciszek et al. |
| 4,627,887 A | 12/1986 | Sachs |
| 4,661,200 A | 4/1987 | Sachs |
| 4,689,109 A | 8/1987 | Sachs |
| 5,147,841 A | 9/1992 | Wilcoxon |
| 5,620,904 A | 4/1997 | Hanoka |
| 5,741,370 A | 4/1998 | Hanoka |
| 5,762,720 A | 6/1998 | Hanoka et al. |
| 5,986,203 A | 11/1999 | Hanoka et al. |
| 6,090,199 A | 7/2000 | Wallace, Jr. et al. |
| 6,114,046 A | 9/2000 | Hanoka |
| 6,146,483 A | 11/2000 | Hanoka et al. |
| 6,187,448 B1 | 2/2001 | Hanoka et al. |

(Continued)

FOREIGN PATENT DOCUMENTS

WO      WO97/24224      7/1997

(Continued)

OTHER PUBLICATIONS

Baldwin, R. K.; Pettigrew, K. A.; Ratai, E.; Augustine, M. P.; and Kauzlarich, S. M.; *Chem Commun.*; 2002; pp. 1882-1883.

(Continued)

*Primary Examiner*—Robert Kunemund
(74) *Attorney, Agent, or Firm*—Proskauer Rose LLP

(57) ABSTRACT

Group IV nanocrystals, such as, for example, silicon nanocrysals and germanium nanocrystals, with chemically accessible surfaces are produced in solution reactions. Group IV halides can be reduced in organic solvents such as 1,2-dimethoxyethane (glyme), with soluable reducing agents to give halide-terminated group IV nanocrystals, which can then be easily functionalized with alkyl lithium, Grignard or other reagents to synthesize group IV nanocrystals having air and moisture stable surfaces. Synthesis can occur at ambient temperature and pressure.

35 Claims, 14 Drawing Sheets

U.S. PATENT DOCUMENTS

| | | | |
|---|---|---|---|
| 6,200,383 | B1 | 3/2001 | Wallace, Jr. et al. |
| 6,206,996 | B1 | 3/2001 | Hanoka et al. |
| 6,217,649 | B1 | 4/2001 | Wallace, Jr. et al. |
| 6,268,041 | B1 * | 7/2001 | Goldstein .................. 428/208 |
| 6,278,053 | B1 | 8/2001 | Hanoka et al. |
| 6,320,116 | B1 | 11/2001 | Hanoka |
| 6,353,042 | B1 | 3/2002 | Hanoka et al. |
| 6,479,316 | B1 | 11/2002 | Hanoka et al. |
| 2005/0029678 | A1 * | 2/2005 | Hanrath et al. ............. 257/784 |

FOREIGN PATENT DOCUMENTS

| | | |
|---|---|---|
| WO | WO 01/14250 | 3/2001 |
| WO | WO 01/38222 | 3/2001 |

OTHER PUBLICATIONS

Baldwin, R. K.; Pettigrew, K. A.; Carno, J. C.; Power, P. P.; Liu, G.; and Kauzlarich, S. M.; *J Am Chem. Soc.*; 2002 vol. 124; pp.1150-1151.

Bley, R. A.; Kauzlarich, S. M.; *J. Am. Chem. Soc.*; 1996 vol. 118; pp. 12461-12462.

Bley, R. A.; Kauzlarich, S. M.; Ed Fendler, J. H.; Ed.; *Nanopart Nanostruct. Film*, Wiley-VCH: Weinheim, Germany, 1998; pp. 101-118.

Dhas, N. A.; Raj, C. P.; Gedanken, A.; *Chem. Mater.*; 1998 vol. 10; p. 3278.

Fojtik, A.; Henglein, A.; *Chem. Phys. Lett.*; 1994 vol. 221; pp. 363-367.

Heath, J. R.; *Science*; 1992 vol. 258; pp. 1131-1133.

Holmes, J. D.; Ziegler, K. J.; Doty, R. C.; Pell, L. E.; Johnston, K. P.; Korgel, B. A.; *J. Am. Chem. Soc.*; 2001 vol. 123; pp. 3742-3748.

Kornowski, A.; Giersig, M.; Vogel, R.; Chemseddine, A.; Weller, H.; *Adv. Mater*; 1993 vol. 5; p. 634.

Littau, K. A.; Szajowski, P. J.; Muller, A. J.; Kortan, A. R.; Brus, L. E.; *J. Phys. Chem.*; 1993 vol. 97; p. 1224.

Mayeri, D.; Philips, B. L.; Augustine, M. P.; Kauzlarich, S. M.; *Chem. Mater.*; 2001 vol. 13; p. 765.

Sweryda-Krawiec, B.; Cassagneau, T.; and Fendler, J.H.; *J. Phys. Chem. B*; 1999 vol. 103; pp. 9524-9529.

Wilcoxon, J. P.; Samara, G. A.; Provencio, P. N.; *Phys. Rev. B*; 1999 vol. 60; p. 2704.

Wilcoxon, J. P.; Samara, G. A.; *Appl. Phys. Lett.*; 1999 vol. 74; p. 3164.

Yang, C.-S.; Bley, R. A.; Kauzlarich, S. M.; Lee, H. W. H.; Delgado, G. R.; *J. Am. Chem. Soc.*; 1999 vol. 121; pp. 5191-5195.

Yang, C.-S.; Liu, Q.; Kauzlarich, S. M.; Philips, B.; *Chem. Mater.*; 2000 vol. 12; p. 983.

Zhang, D.; Kolbas, R. M.; Mehta, P.; Singh, A. K.; Lichtenwalner, D. J.; Hsieh, K. Y.; Kingon, A. I.; *Mater. Res. Soc. Symp. Proc.*; 1992; pp. 35-40.

PCT/US02/29610 International Search Report Feb. 2, 2003.

Baldwin, et al. "Room Temperature Solution Synthesis of Alkyl-Capped Tetrahedral Shaped Silicon Nanocrystals." J. Am. Chem. Soc.; vol. 124, 2002, pp. 1150-1151.

Hope-Weeks, Lousia. "Time dependent size and shape control of germanium nanocrystals." Chem. Commun.; vol. 24, 2003, pp. 2980-2981.

Zou, et al. "Solution synthesis of ultrastable luminescent siloxane-coated silicon nanoparticles." Nano Letters.; vol. 4(7), 2004, pp. 1181-1186.

Kauzlarich, et al., "The Novel Synthesis of Silicon and Germanium Nanocrystallites," Mat. Res. Soc. Symp. Proc. vol. 638 2001 Materials Research Society, pp. F6.5.1-F.6.5.6.

Taylor, et al. "Solution preparation of Ge nanoparticles with chemically tailored surfaces," Materials Science & Engineering B, 2002, pp. 90-93.

* cited by examiner

METHOD FOR PREPARING GROUP IV NANOCRYSTALS WITH CHEMICALLY ACCESSIBLE SURFACES

RELATED APPLICATIONS

This application is a continuation-in-part of U.S. application Ser. No. 10/247,757 entitled "HIGH YIELD METHOD FOR PREPARING SILICON NANOCRYSTALS WITH CHEMICALLY ACCESSIBLE SURFACES" by Kauzlarich et al. and filed on Sep. 19, 2002, now U.S. Pat. No. 6,855,204, which claims the benefit of the filing date of U.S. Provisional Patent Application Ser. No. 60/323,285, filed on Sep. 19, 2001. The entire disclosures of both related applications are herein incorporated by reference.

GOVERNMENT RIGHTS

The subject matter described herein was supported in part by NIST Advanced Technology Program, Contract No. 70 NANBOH3028. The U.S. Government has certain rights in this invention.

TECHNICAL FIELD

The invention generally relates to group IV nanocrystals. More particularly, the invention relates to group IV nanocrystals having chemically accessible surfaces and methods of their preparation.

BACKGROUND OF THE INVENTION

There has been relatively little research into the synthesis of group IV nanocrystals (e.g., silicon nanocrystals, germanium nanocrystals) via solution methods despite the interesting optical and electronic properties that make them important for future technological applications. Silicon nanocrystals exhibit visible luminescence. The wavelength of the luminescence is proportional to the size of the nanocrystal. Since silicon is an important electronic material with applications ranging from computer chips to photovoltaics, nanoelectronics based on silicon has tremendous potential. In addition, since silicon is a biocompatible element, there are many possible applications in the field of biology and medicine as an inorganic fluorescent probe, a biosensor, or a drug delivery agent. The largest barrier to the utilization of nanocrystalline silicon is the lack of a high yield synthetic method that gives rise to good quality silicon nanocrystals.

Several possible methods for producing silicon nanoparticles have been attempted. These methods include the gas phase and solution decompostion of silanes, the reactions of silicon Zintl salts with silicon halides as well as the solution reduction of silicon halides by sodium, lithium naphthalenide or hydride reagents or reduction of $Si(OEt)_4$ with sodium. While some of these methods are solution reduction methods, it has been suggested that both high temperatures and pressures achieved by bomb reactions, ultrasonication, or annealing after synthesis are required to generate crystalline silicon. In addition, these techniques often give rise to surface oxide contamination.

SUMMARY OF THE INVENTION

It has now been discovered that crystalline group IV nanocrystals, such as, for example, germanium nanocrystals and silicon nanoparticles, with well defined crystal facets and chemically accessible surfaces can be produced at ambient temperatures and pressures in a simple one or two-step solution synthesis.

In one aspect, the invention generally features a method for producing germanium nanocrystals. In one embodiment, the method includes the steps of: contacting a germanium halide and a first reducing agent in a first organic solvent to produce halide-terminated germanium nanocrystals; and contacting the halide-terminated germanium nanocrystals and a second reducing agent along with a preselected termination group in a second organic solvent to produce germanium nanocrystals terminated with the preselected termination group.

Embodiments may include one or more of the following features. The first and second reducing agent may include one or more of the following: an elemental metal (e.g., in bulk form or in finely divided form), a naphthalenide, a liquid alloy comprising one metal component, a mixture of an alkali metal and a phase transfer catalyst, an aromatic anion, an alkyl metal compound, a metal hydride, and an activated magnesium reagent. The first and second reducing agents may be identical. The second reducing agent may also act as a terminating group. The second reducing agent can be a Grignard reagent and the preselected termination group can be a butyl group. The preselected termination group can also be selected from the group consisting of an alkyl termination group, a hydride termination group, an alkoxy termination group, an amino termination group, and mixtures thereof. The first and second organic solvents may include one or more of the following: a polyether having a formula of $MeO(CH_2CH_2O)_nMe$, tetrahydrofuran, 1,4-dioxane, benzene, toluene, and hexane. The first and second organic solvents may be identical.

In certain embodiments, at least one of the steps of contacting a germanium halide and a first reducing agent in a first organic solvent and contacting the halide-terminated germanium nanocrystals and a second reducing agent along with a preselected termination group in a second organic solvent is carried out at ambient temperature and pressure. In some embodiments, both steps of the method are carried out at ambient temperature and pressure. In some embodiments, the steps are carried out concurrently in one reaction.

In another aspect, the invention generally features a method for producing germanium nanocrystals. In one embodiment, the method includes reducing a germanium halide with a reducing agent in an organic solvent at ambient temperature and pressure to produce halide-terminated nanocrystals. Embodiments of the invention may include one or more of the following features. The germanium halide used is germanium tetrachloride. The reducing agent may include finely divided magnesium or a naphalenide, such as, for example, sodium naphalenide.

In yet another aspect, the invention generally features a method for producing phosphorus doped group IV nanocrystals. In one embodiment, the method includes contacting a group IV halide and a phosphorus halide with a first reducing agent in a first organic solvent to produce a halide terminated phosphorus doped group IV nanocrystal, and contacting the halide terminated phosphorus doped group IV nanocrystal and a second reducing agent along with a preselected termination group in a second organic solvent to produce phosphorus doped group IV nanocrystals terminated with the preselected termination group.

Embodiments of this aspect of the invention may include one or more of the following features. The group IV halide includes a silicon halide, such as, for example, silicon tetrachloride. The phosphorus halide used in some embodiments of the invention is phosphorus trichloride. The preselected termination group can include an octyl group. In certain embodiments, both of the steps of contacting a group IV halide and a phosphorus halide with a first reducing agent in a first organic solvent, and contacting the halide terminated phosphorus doped group IV nanocrystal and a second reducing agent along with a preselected termination group in a second organic solvent are carried out at a temperature of about 50° C. or less.

DESCRIPTION

In general, the disclosed method is a two-step synthesis, although a one step process can be designed for synthesis of nanocrystals terminated with certain functional groups.

Figure 1:
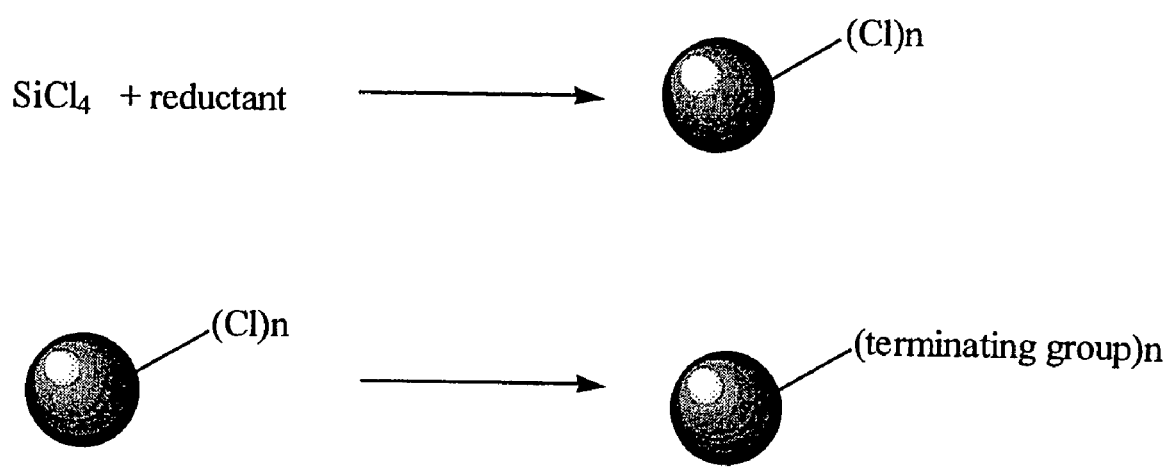
FIG. 1 schematically illustrates one embodiment of synthesis of silicon nanocrystals.

As illustrated in FIG. 1, in one embodiment, a group IV tetrahalide such as silicon tetrachloride ($SiCl_4$) is first reduced in an organic solvent with a suitable reductant to produce halide terminated silicon nanocrystals. The halide-terminated silicon nanocrystals thus obtained can then be functionalized (i.e., terminated) with a desired ligand.

The first step is typically conducted at room temperature and under atmospheric pressure. Any solvent can be used as long as it provides the desired solubility and is inert to the reaction carried out therein. Illustrative examples of such solvents include polyethers such as 1,2-dimethoxyethane (glyme), 2-methoxyethylether (diglyme), triethyleneglycoldimethylether (triglyme) and other polyethers of the form $MeO(CH_2CH_2O)_n Me$. Other illustrative examples of solvents include tetrahydrofuran, 1,4-dioxane, aromatic solvents (e.g., benzene and toluene), and alkanes (e.g., hexane).

Silicon halides that can be used as starting material include silicon halides having a chemical formula of $SiX_4$, mixed silicon halides having a chemical formula of $R_n SiX_{(4-n)}$, and mixtures thereof, wherein X is a halide, R is an alkyl group, and n=0, 1, 2, or 3. Mixtures of two or more of these halides can also be used. In addition, the disclosed method can also be applied to elements other than silicon such as $EX_4$, where E is any group IV element (e.g., silicon, germanium, carbon, tin, and lead) and X is a halide (e.g., chloride, bromine, fluoride, iodine). For example, $SiBr_4$ can be reduced with a reductant in a solvent and then the resulting bromine terminated nanocrystal is terminated as described below. A mixed silicon halide may also be used in the same synthetic scheme.

Many reductants can be used in the reduction of group IV halides (e.g., the reduction of $SiCl_4$ to Si having a potential of about −0.24 V, the reduction of $GeCl_4$ to Ge having a potential of about −0.89 V (basic) and about 0.12 V (acidic). Illustrative reducing agents that can be used as the first and/or the second reducing agent include elemental metals such Li, Na, K, Rb, Cs, Mg, Ca, Zn, Al in either bulk or finely divided forms or as a liquid alloy such as Na/K or Hg/Na, Hg/K, Hg/Li, Zn, Al or alkali metals with phase transfer catalysts such as crown ethers; compounds of these metals such as naphthalenides, anthracenides, or acenaphthalenides or other conjugated aromatic anions of Li, Na or K; compounds of these metals such as alkyllithiums, alkyl aluminiums, alkyl zincs; metal hydrides such as $CaH_2$, KH and NaH or $LiAlH_4$; Grignard reagents, various activated forms of magnesium and other organomagnesium reagents such as magnesium anthracenide. The first and second reducing agents can be different or identical. Furthermore, more than one reducing agent can be used as the first or the second reducing agent.

In the second step, which is also typically conducted at room temperature and under atmospheric pressure, a large number of surface termination groups can be introduced to the group IV nanocrystals. For example, for silicon nanocrystals, the atom connecting to the silicon can be carbon to give hydrocarbon termination, hydrogen to give hydride termination, oxygen to give alkoxide termination, nitrogen to give amine termination, or sulfur or any number of other heteroatoms. Beyond the connecting atom, the nature of the termination group can vary. Any organic or inorganic group can be envisaged including termination groups containing functionality. These functionalities can then be further modified using conventional organic or inorganic chemistry to produce more complex chemical surfaces including oligomeric or polymeric groups.

In one embodiment, the second reducing agent also provides the preselected termination group. For example, an alkyllithium (e.g., n-butyllithium) may be used both as a reducing agent and as a source of alkyl termination groups. Other reducing agents that may provide termination groups include alkoxides (e.g., butoxide) as a source of alkoxide termination groups, anionic amine compounds (e.g., lithium bis(trimethylsilyl)amine) for amino terminating groups, and metal hydrides (e.g., diisobutylaluminium hydride) for hydride terminating groups.

Illustrative examples of alkyl termination include termination by a substituted or unsubstituted alkyl group such as a methyl group, an ethyl group, a propyl group, a butyl group, a pentyl group, and a hexyl group. Illustrative examples of alkoxide termination include termination by a substituted or unsubstituted alkoxy groups such as a methoxy group, an ethoxy group, a propoxy group, a butoxy group, a pentoxy group, and a hexoxy group. Illustrative examples of amine termination include termination by a substituted or unsubstituted amine such as a dimethyl amino group.

In one embodiment, tetrahedral shaped silicon nanocrystals are produced by sodium naphthalenide reduction of silicon tetrachloride in 1,2-dimethoxyethane followed by surface termination with an excess of n-butyllithium. The preferred stoichiometry of the reaction is calculated such that after complete consumption of the sodium, the silicon:chlorine ratio would be 4:1. Without being bound to the theory, an active Si—Cl surface should be left on the particles formed, which allows surface termination with n-butyllithium. The use of sodium naphthalenide rather than bulk sodium ensures homogeneity of the reaction mixture. Both the $^1$H and $^{13}$C NMR spectra displayed broad resonances in a region consistent with the presence of n-butyl groups as well as aromatic resonances due to surface naphthalene moieties.

Hexane solutions of these particles showed no evidence of photoluminesence attributable to silicon nanocrystal quantum confinement. For such effects to be observed, the particles need to be substantially smaller.

Without being bound to the theory, a Wurtz type coupling mechanism can be used to explain the oligimerization of silicon chloride precursors into a nanocrystal. Sodium naphthalenide acts as a soluble and active source of sodium metal. It can exchange alkali metal for halide on silicon. The resulting species can then react with another silicon halide to give a silicon silicon bond. This can explain both the intermolecular formation of Si—Si bonds needed to add an atom to the growing cluster, as well as the intramolecular bond formation required to close the six membered rings of silicon diamond structure.

In one embodiment, more than 80% of the silicon nanocrystals produced are tetrahedral in shape. In another embodiment, more than 90% of the silicon nanocrystals produced are tetrahedral in shape. In yet another embodiment, more than 95% of the silicon nanocrystals produced are tetrahedral in shape. Again, without being bound to the theory, in tetrahedral crystals of a diamond cubic crystal type, the (111) plane must give rise to the facets. For a given single crystal, the most prevalent faces will be those that grow slowest. The face with the greatest surface roughness and largest number of dangling bonds will give rise to the fastest growth, while the smoothest with the least number of dangling bonds will have the slowest face growth and thus be the most prevalent face. In the case of diamond crystalline silicon, choice of facet greatly changes the number of dangling bonds. Cleavage through the (111) plane gives rise to surface silicon atoms with only one dangling bond whereas through other planes surface silicon atoms with more dangling bonds are observed. The slow growth of the (111) plane is consistent with this.

In one embodiment, silicon nanocrystals are produced by the sodium naphthalide reduction of $SiCl_4$, followed by termination with 1-octanol. The particles thus produced have a mean diameter of 5.2±1.2 nm. They are crystalline and faceted in the high resolution TEM. The solution $^1$H NMR and IR are both consistent with octanoxide groups on the surface. These particles are small enough to exhibit photoluminescence. For an excitation at 320 nm emission is observed in the 410–420 nm range. $^{29}$Si{$^1$H} CP MAS NMR of these nanocrystals, as well as energy dispersive x-ray spectroscopy confirm the nanocrystals are silicon.

Any solvent may be used in the second step of the synthesis as long as the desired group IV nanocrystals are produced. Illustrative examples of such solvents include polyethers such as 1,2-dimethoxyethane (glyme), 2-methoxyethylether (diglyme), triethyleneglycoldimethylether (triglyme) and other polyethers of the form MeO$(CH_2CH_2O)_n$Me. Other illustrative examples of solvents include tetrahydrofuran, 1,4-dioxane, aromatic solvents (e.g., benzene and toluene), and alkanes (e.g., hexane). In certain embodiments, identical solvent(s) is employed in the first and the second steps. A single or a mixture of solvents may be used in the first and/or the second step of the synthesis.

In one embodiment, the nanocrystals (e.g., silicon nanocrystals, germanium nanocrystals) that are produced by the disclosed method typically range from about 1 nm to about 100 nm. The size of the nanocrystals and the size distribution can be controlled. In one detailed embodiment, 95% of the nanocrystals fall within the 1 nm to 80 nm range and 80% fall within 1 nm to 70 nm range. In another detailed embodiment, 80% of the nanocrystals fall within 1 nm to 50 nm range. In yet another detailed embodiment, 80% fall within 1 nm to 10 nm range.

In some embodiment, the yield of group IV nanocrystals is more than 90% and typically is more than 95% by weight of group IV element in the starting material. For example, in some embodiments, the yield of silicon nanocrystals is more than 95% by weight of silicon in the starting material (i.e., the silicon halide). Quantitative transformation from silicon tetrahalide to silicon nanocrystals can also be achieved.

Group IV nanocrystals, such as butyl-terminated silicon nanocrystals, prepared according to the disclosed method are free from surface contamination and are air and moisture stable. In one embodiment, silicon nanocrystals prepared are stable at ambient air and moisture conditions for at least one day. In another embodiment, silicon nanocrystals prepared are stable at ambient air and moisture conditions for at least one week.

In one embodiment, the synthesis can be completed in a single step. For example, a mixture of $R_nSiX_{(4-n)}$ (e.g., t-BuSiCl$_3$) and SiX$_4$ (e.g., SiCl$_4$), where R is an alkyl group, X is a halide, and n is 0, 1, 2, or 3, can be reduced in a solvent with a reductant. The already substituted t-BuSiCl$_3$ provides the termination groups on reduction while the SiCl$_4$ provides the crystalline core of the silicon nanocrystal on reduction.

The advantages of the disclosed method over the current state of the art include the chemical accessibility of the chloride termination, allowing easy access to different terminating groups, as group IV-chloride bonds can easily be replaced by group IV other element bonds. The advantages also include reaction conditions of ambient temperature and pressure, the easy increase in scale, and the ability to control the yield of the silicon or other group IV nanocrystals formed. The flexible nature of the synthetic procedure also allows control of the size and shape of the nanocrystals formed. For example, reduction of SiCl$_4$ with sodium naphthalenide followed by termination with BuLi generates large tetrahedral silicon nanocrystals while reduction of silicon tetrachloride with sodium naphthalenide followed by termination with octanol gives rise to substantially smaller silicon nanocrystals of less well defined shape. The group IV halide starting material, especially silicon tetrachloride, is relatively inexpensive and readily available. In addition, such an easily manipulated solution route allows preparation of doped group IV nanocrystals, such as, for example doped silicon nanocrystals, as a great variety of potential dopants can be readily introduced in a solution.

EXAMPLES

The following examples are provided to further illustrate and to facilitate the understanding of the invention. These specific examples are intended to be illustrative of the invention and are not intended to be limiting.

Example 1

Silicon nanocrystals were formed at ambient temperatures and pressure from the reduction of silicon tetrachloride (SiCl$_4$) with sodium naphthalenide. To form the nanocrystals, a tetrahydrofuran solution of sodium naphthalenide (0.9 g, 39 mmol Na and 3.23 g, 25 mmol of naphthalene in 30 cm$^3$ tetrahydrofuran stirred for three hours) was added rapidly at room temperature via cannula to a 500 cm$^3$ Schlenk flask containing 300 cm$^3$ of 1,2-dimethoxyethane and 1.14 g, 6.7 mmol of SiCl$_4$ with rapid stirring. On completion of the naphthalenide addition a large excess of n-butyllithium (10 cm$^3$, 1.6M in hexane) was added immediately. The solvent was removed under vacuum from the resulting yellow brown suspension. The residue was extracted with hexane and washed with water to remove sodium and lithium salts. Evaporation of the hexane layer followed by heating under vacuum to remove residual naphthalene gave 0.7 g of a viscous yellow oil.

Figure 2:
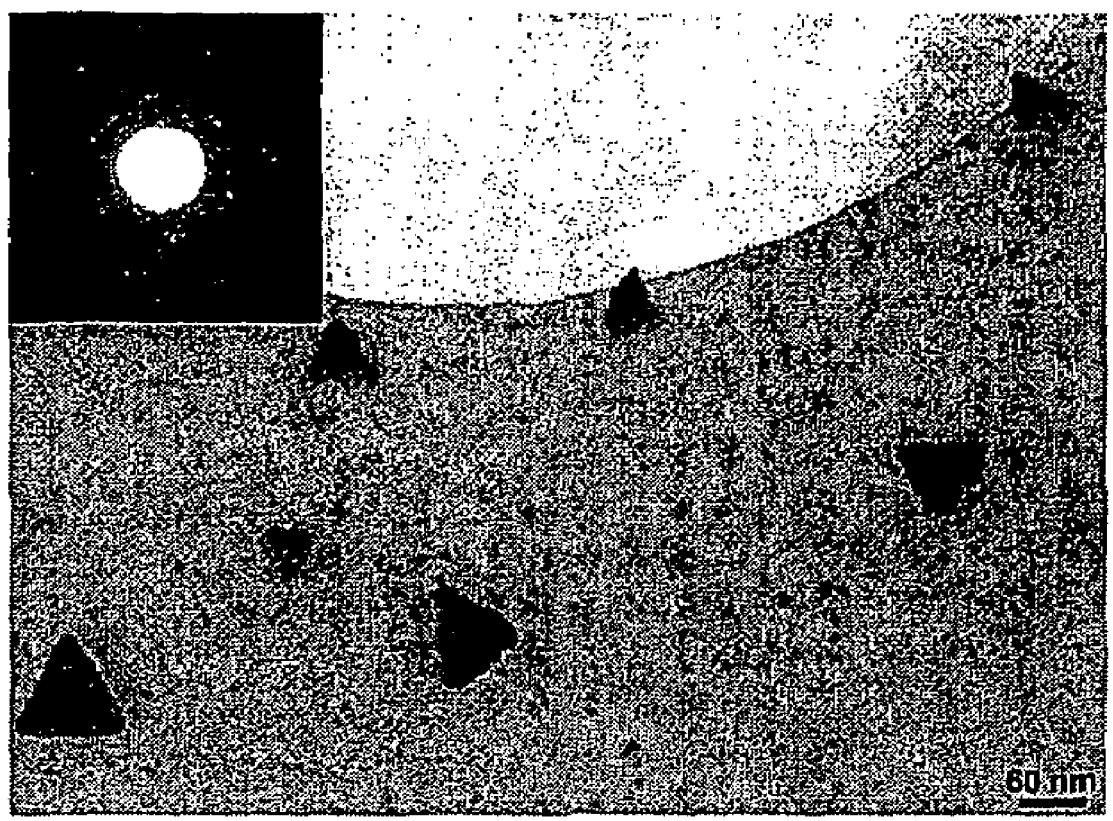
FIG. 2 shows transmission electron microscope and selected area electron diffraction images of silicon nanocrystals synthesized according to an embodiment of the invention.

Transmission electron microscopy (TEM) shows the presence of crystalline silicon tetrahedra (e.g., the reaction product of the reduction of SiCl$_4$ with sodium naphtalenide) of approximately 60 nm in edge length. The bright-field TEM image of a number of the silicon nanocrystals on a holey carbon grid, along with the selected area electron diffraction (SAED) pattern is given in FIG. 2. In FIG. 2, darkness is relative to electron beam opacity of the sample. To prepare the TEM grids the sample was diluted approximately 100 fold in hexane and sonicated to resuspend the nanocrystals. A 20 µL aliquot of this solution is dropped on a holey carbon grid which was then dried in an oven at 120° C. for 1 hour. The dark triangular shapes are the silicon nanocrystals. The particles are faceted with tetrahedral morphology. The SAED (inset in the top left of FIG. 2) spot pattern is consistent with the silicon diamond lattice. A survey of fifty-five particles from several different areas on the grid gave edge lengths between 40 and 130 nm with 95% of the particles falling within the 40–80 nm range and 80% falling within the 50–70 nm range.

Figure 3:
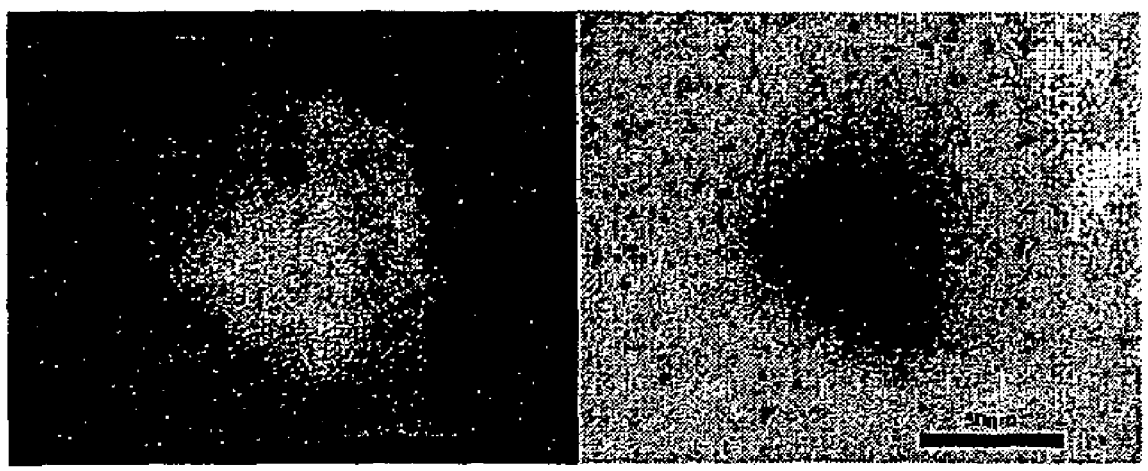
FIG. 3 shows scanning electron microscope and transmission electron microscope images of a silicon nanocrystal synthesized according to an embodiment of the invention.
Figure 4:
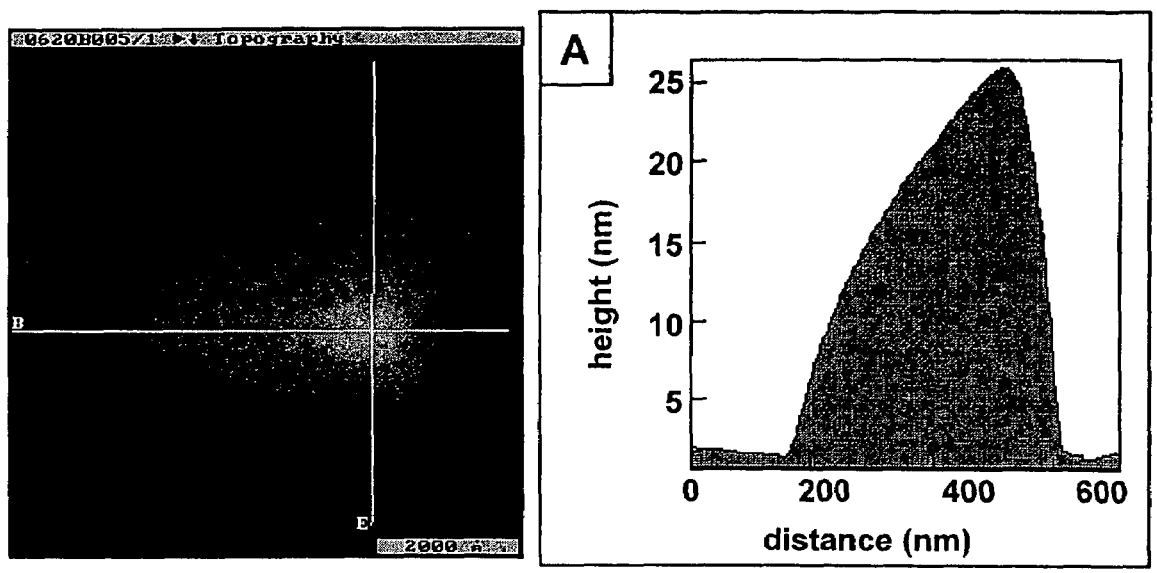
FIG. 4 shows an atomic force microscope image of a silicon nanocrystal synthesized according to an embodiment of the invention.

Solution NMR spectroscopy of the resulting yellow oil was consistent with surface alkyl termination. This is also confirmed by scanning electron microscopy (SEM), FIG. 3, which shows larger SEM image than those in TEM, consistent with the nanocrystals being covered with an organic layer that images in the SEM but does not image in the TEM. In FIG. 3, the left image is a SEM image of a silicon nanocrystal while the right image is the TEM image of the same nanocrystal at the same magnification. It can be seen that the TEM image is much smaller than the SEM image. The three-dimensional geometry of the silicon nanocrystals are confirmed by atomic force microscopy (AFM). FIG. 4 shows an AFM topograph of a typical nanocrystal.

Example 2

Silicon nanocrystals were formed at ambient temperatures and pressure from the reduction of silicon tetrachloride (SiCl$_4$) with sodium naphthalenide. Sodium naphthalenide, prepared from sodium (0.69 g) and nanphthalene (2.39 g) stirred in 70 cm$^3$ of 1,2-dimethoxyethane overnight, was added rapidly via cannula to a stirred solution of 1.04 g of SiCl$_4$ in 1,2-dimethoxyethane. The dark brown suspension obtained was stirred for a further 30 minutes then 5 cm$^3$ of 1-octanol was added. A yellow solution with a white precipitate was observed immediately. The solvent and naphthalene were removed immediately with heating in a water bath. The resulting orange solid was extracted with hexane and washed three times with slightly acidic distilled water. The hexane layer was collected and pumped down to give a waxy orange hexane soluble solid. Solution $^1$H NMR was consistent with octanoxide groups on the surface of the nanocrystals. This was also supported by the IR spectrum in which a Si—OR stretch was observed at ~1080 cm$^{-1}$ and an alkyl C—H stretch at 3000 cm$^{-1}$.

Figure 5:
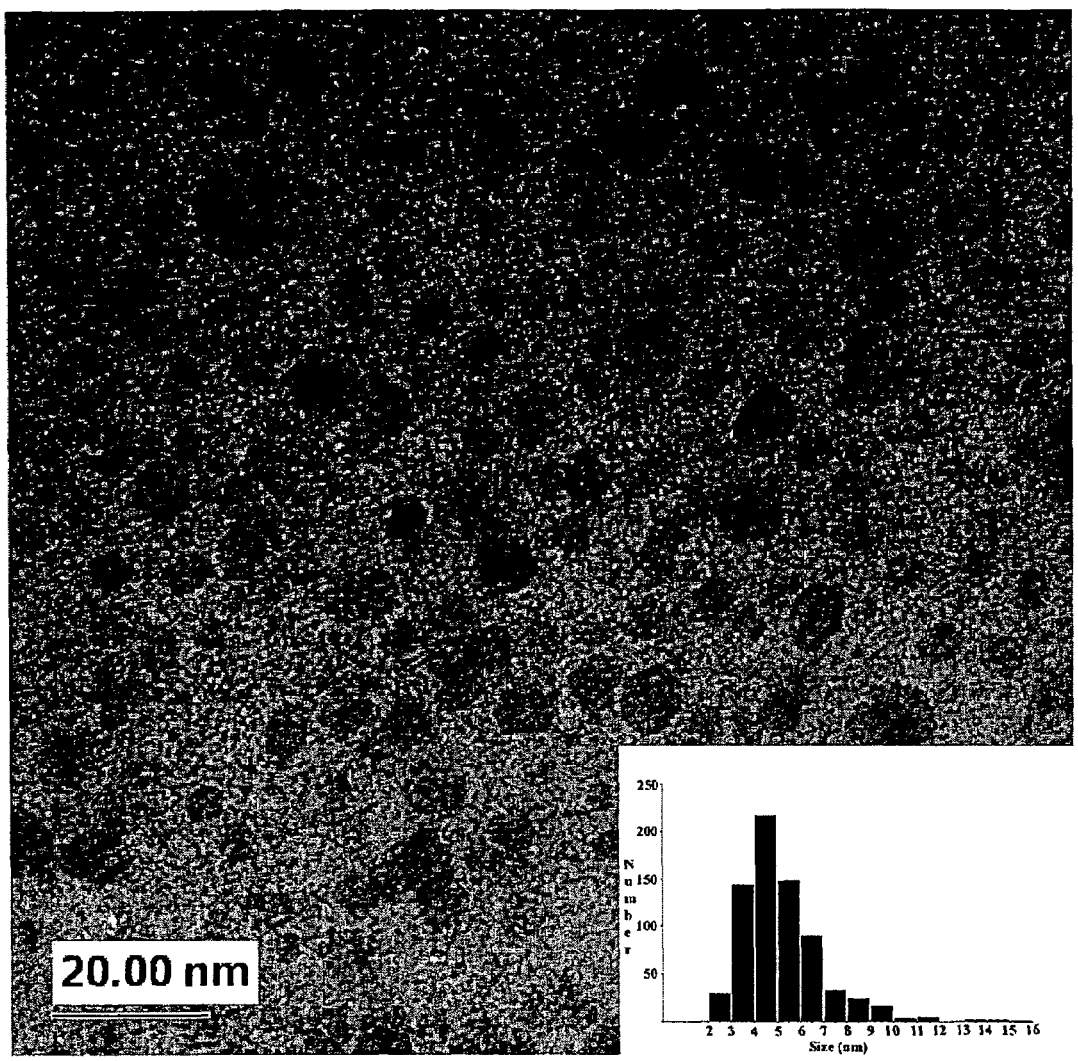
FIG. 5 shows a high resolution transmission electron microscope image of silicon nanocrystals synthesized according to an embodiment of the invention.
Figure 6:
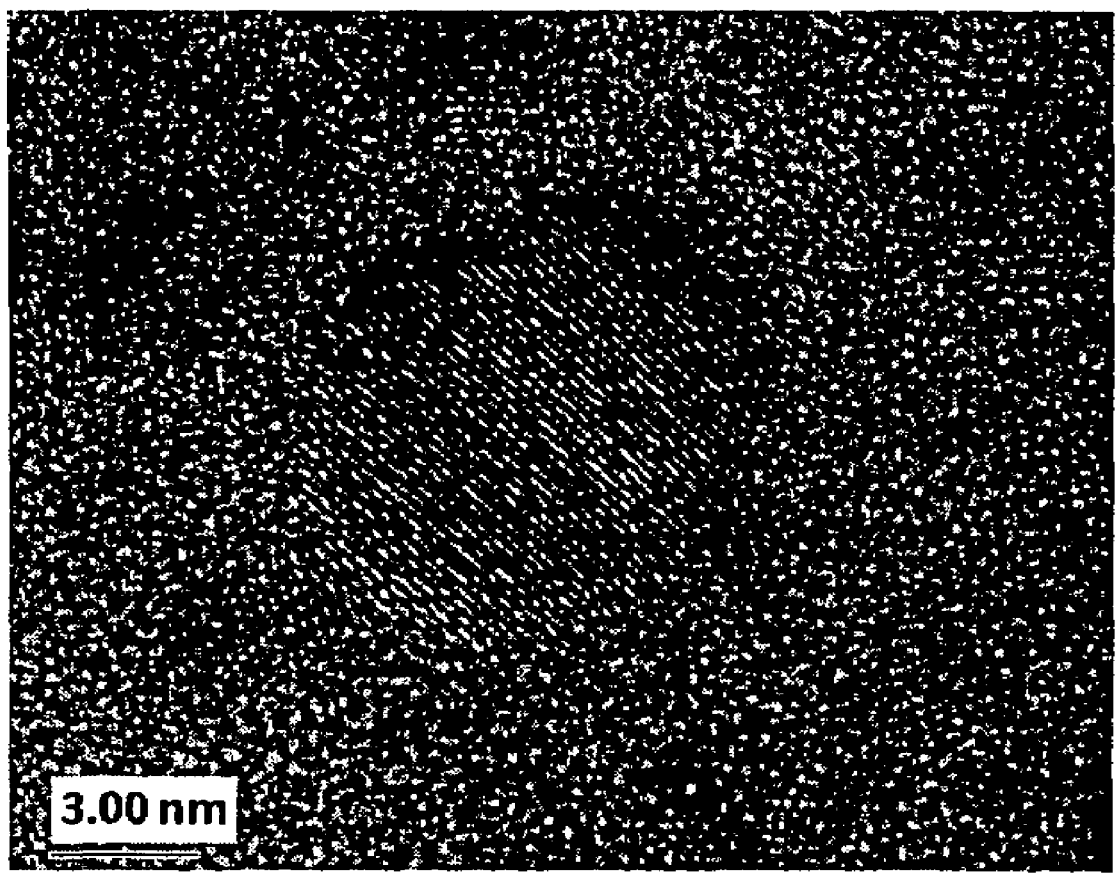
FIG. 6 shows a high resolution transmission electron microscope image of silicon nanocrystals synthesized according to an embodiment of the invention.
Figure 7:
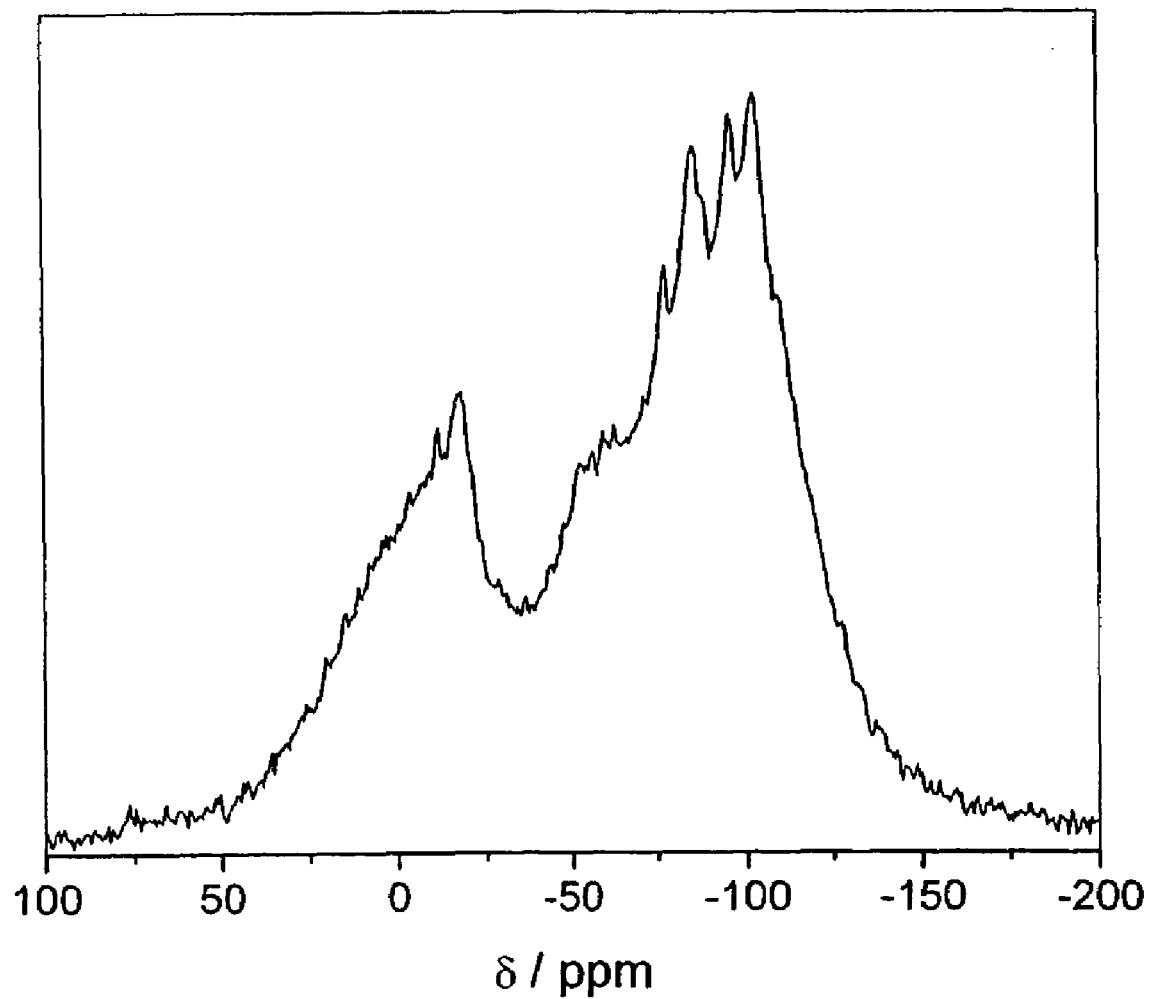
FIG. 7 shows a $^{29}$Si {$^{1}$H} CP MAS NMR of silicon nanocrystals synthesized according to an embodiment of the invention.

Holey carbon grids for TEM were prepared by suspending the nanocrystals in hexane with ultrasonication, then dipping the grid into the suspension thus obtained and then allowing the solvent to evaporate. FIG. 5 gives a high resolution TEM image of an area on the grid along with a histogram of sizes. The dark spots are nanocrystals. The mean diameter of the observed particles was found to be 5.2±1.9 nm from a survey of 718 nanocrystals. FIG. 6 gives a high resolution image of a large silicon nanocrystal. The particle is crystalline and faceted. The lattice fringes of the particle are clearly visible, the spacing of 0.314 nm consistent with the <111> plane of diamond crystalline silicon. Energy dispersive x-ray spectroscopy also confirms the presence of silicon, as does solid state 29Si{$^1$H} CP MAS NMR (FIG. 7).

Example 3

Silicon nanocrystals were formed from the reduction of SiCl$_4$ with finely divided magnesium at ambient temperatures and pressure. The finely divided magnesium powder (0.47 g) was suspended with sonication in 70 cm$^3$ of dry 1,2-dimethoxyethane. To this was added 1.18 cm$^3$ of SiCl$_4$ and the resulting suspension sonicated overnight. To the red/brown solution and gray precipitate thus obtained was added 2 cm$^3$ of 20% MgBuCl in tetrahydrofuran. The solvent and any other volatiles were removed under vacuum, the resulting colorless oil taken up in hexane, washed with slightly acidified water and again pumped down to a colorless oil. The oil contained small silicon nanoparticles by TEM (<20 nm). $^1$H NMR and IR confirmed the existence of terminating butyl groups.

Example 4

Silicon nanocrystals were formed from the reduction of SiCl$_4$ with sodium naphthalene at ambient temperatures and pressure. Naphthalene (3.061 g) and sodium (0.8 g) were stirred in 60 cm$^3$ of dry 1,2-dimethoxyethane for 2 days. The mixture was then added to a solution of 0.58 g of $SiCl_4$ and 0.65 g of t-$BuSiCl_3$ in 300 $cm^3$ of 1,2-dimethoxyethane at 0° C. over a period of three minutes. A deep yellow/brown solution was obtained. Glyme and naphthalene were removed under reduced pressure and the resulting oil extracted with hexane. $^1H$ NMR was consistent with the presence ofterminating t-butyl groups while the TEM showed crystalline silicon nanoparticles of a range of sizes.

Example 5

Silicon nanocrystals were formed at 25° C. from silicon tetrabromide and sodium naphthalenide. A solution of sodium naphthalenide in glyme was prepared by reaction of stochimetric amount of naphthalene (1.13 g) with sodium metal (200 mg) followed by three hours of stirring at room temperature. At room temperature, 800 mg of silicon tetrabromide in 1,2-dimethoxyethane was injected into the solution to form a mixture. This mixture was stirred for three hours.

Octanol was added to the mixture. The mixture was stirred overnight and upon settling, an orange solid was observed. The solution was removed and the solid was extracted with hexane and washed with water. A small amount of orange oil was obtained (i.e., the reaction product) which was stable in both air and water.

Figure 8:
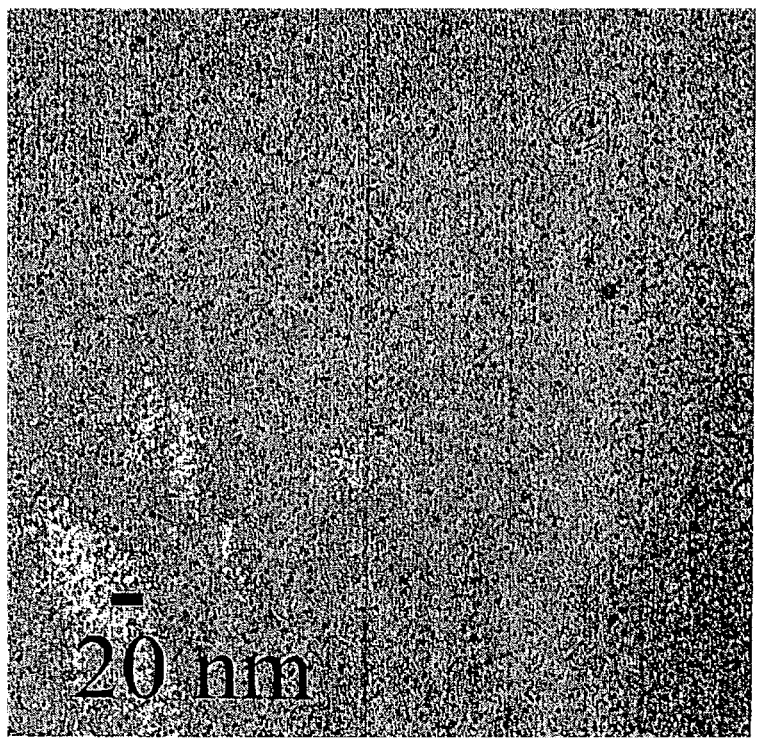
FIG. 8 shows a transmission electron microscope image of silicon nanocrystals synthesized according to an embodiment of the invention.

The oil obtained from the reduction of silicon tetrabromide was diluted in a hexane solution and dripped on a holey carbon grid to form a TEM sample. A bright field TEM image of this sample (see FIG. 8) showed that the particles were circular (i.e., spherical particles) and appeared to be quite uniform in size. Each of the particles had a diameter of approximately 4 nm.

A $^1H$ NMR spectrum of the octyl terminated samples contained resonance only attributable to octyl groups bonded to silicon with a distinctive resonance at δ 0.58 ppm consistent with a $CH_2$ group directly bonded to silicon.

Example 6

Phosphorus doped silicon nanoparticles were produced by the co-reduction of a silicon halide (silicon tetrachloride, $SiCl_4$) and a phosphorus halide (phosphorus trichloride, $PCl_3$) in warm 1,2-dimethoxyethane (glyme) with finely divided magnesium. The finely divided magnesium was produced by thermal decomposition of freshly prepared magnesium anthracenide formed in accordance with "Rate of Formation and Characterization of Magnesium Anthracene" by Bogdanovic, B., Sh.-T. Liao, R. Mynott, K. Schlichteu, and U. Westeppe in *Chem. Ber.* 117, 1378–1392 (1984). Thermal decomposition included heating the magnesium anthracenide from room temperature to 200° C. at 60° C./hour in a quartz boat under vacuum inside a tube furnace. After 12 hours at temperature, the active Mg was obtained as a fine black powder in the quartz boat while the anthracene sublimed out into a $N_2(1)$ cooled trap. Care was taken when handling the Mg powder as it is extremely pyrophoric, and can spontaneously ignite in air. $^1H$ NMR of a deuterated benzene extraction of the black powder showed only a very small amount of residual anthracene contamination.

The finely divided magnesium (96 mg, 3.9 mmol) was stirred under argon at 50° C. in 200 $cm^3$ of 1,2-dimethoxyethane freshly distilled from a sodium potassium alloy to form a suspension in a flask. $SiCl_4$ (201 μL, 1.75 mmol) and $PCl_3$ (38 μL, 0.43 mmol) in 30 $cm^3$ of 1,2-dimethoxyethane was added rapidly to the flask. After 1 hour, a yellow suspension was observed. The reaction was terminated with octyl magnesium chloride (2 $cm^3$ of a 2 M tetrahydrofuran solution). The mixture was allowed to cool overnight and then filtered through a silica plug (2×1 cm) to remove salts. The solvent was removed under vacuum to give an orange oil. The residual volatiles were removed onto a $N_2(1)$ cooled probe under vacuum heating to 100° C. in a water bath. Approximately 200 mg of a hexane soluable viscous orange oil including the particles was obtained.

Figure 9:
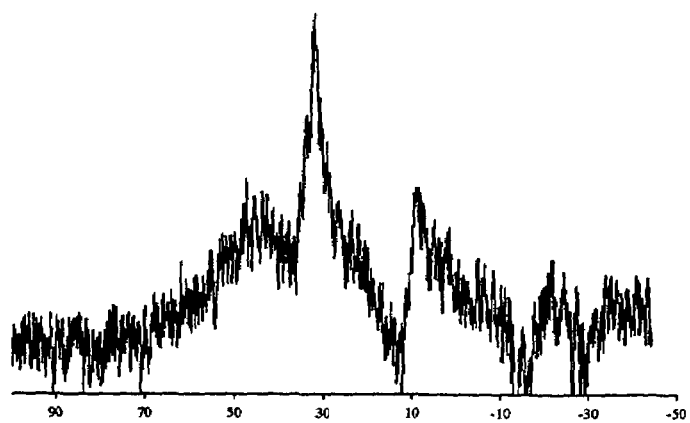
FIG. 9 shows a $^{31}$P NMR spectrum of phosphorus doped silicon nanocrystals synthesized according to an embodiment of the invention.

Solution $^1H$ and $^{13}C$ NMR of the particles in the orange oil in $CDCl_3$ were consistent with the expected octyl termination. In the proton NMR, the protons of the $CH_2$ group closest to silicon was observed at δ 0.58 ppm, the expected region for alkyl silicon compounds. The resonance was much broader than would be expected for a simple molecular species with a $S_1$—$CH_2$ moiety. The resonance was consistent with the range of different environments present on the surface of the nanoparticles, as well as the expected hindrance to fee motion. This resonance also integrates correctly with the triplet observed at δ 0.90 ppm and broad resonance at δ 1.28 ppm. That is, the resonance corresponded to the protons of the terminal $CH_3$ of the alky chain and the protons of the remaining alkyl $CH_2$ groups respectively, thereby suggesting that all of the alkyl groups observed in the NMR were associated with silicon. In the $^{13}C$ APT NMR spectrum, all eight carbons could be clearly distinguished, although the resonances, especially that of the Si—$CH_2$ were broader than would be expected for a simple molecular species containing an octyl moiety. This was again consistent with different environments for the alkyl groups on the surface of the nanoparticles. The spectrum obtained in $^{31}P$ NMR (see FIG. 9) showed the presence of phosphorus with a broad and complicated peak centered at 30 ppm. This peak was lower than the generally accepted value of 65±10 ppm for phosphorus doped polycrystalline silicon, where the phosphorus was found at grain boundaries between silicon grains. However, in the material made in this example, it is believed that the relatively low reaction temperature does not provide enough thermal energy to overcome the thermal barrier to phosphorus atom segregation. As a result, the phosphorus atoms are mixed among the silicon atoms, thereby explaining the lower value of 30 ppm.

Figure 10:
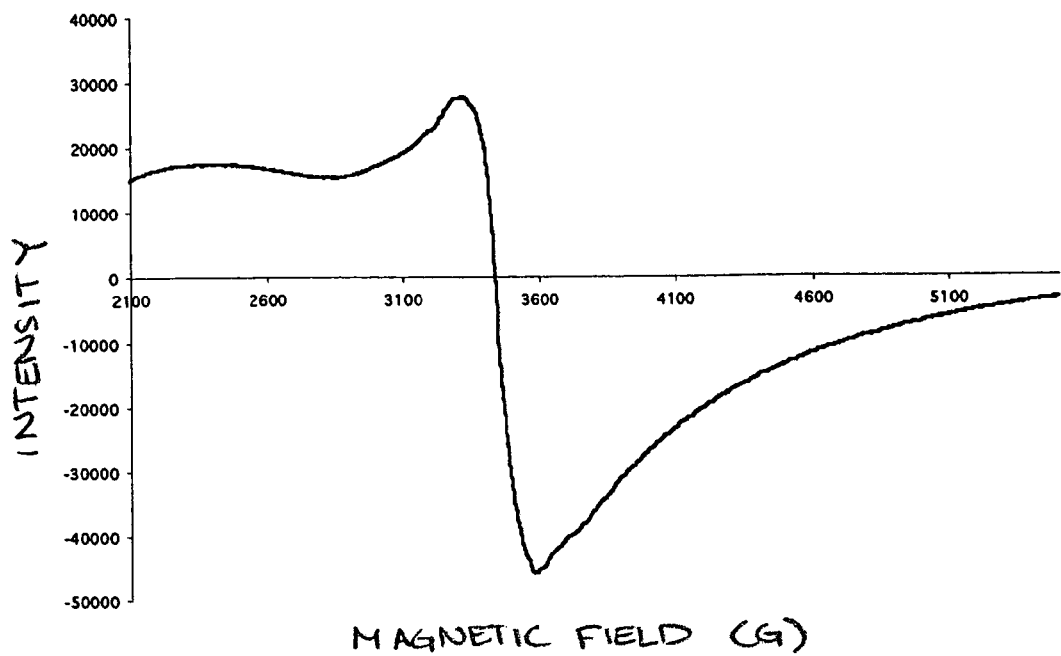
FIG. 10 shows an electron paramagnetic resonance spectrum of phosphorus doped silicon nanocrystals synthesized according to an embodiment of the invention.
Figure 11:
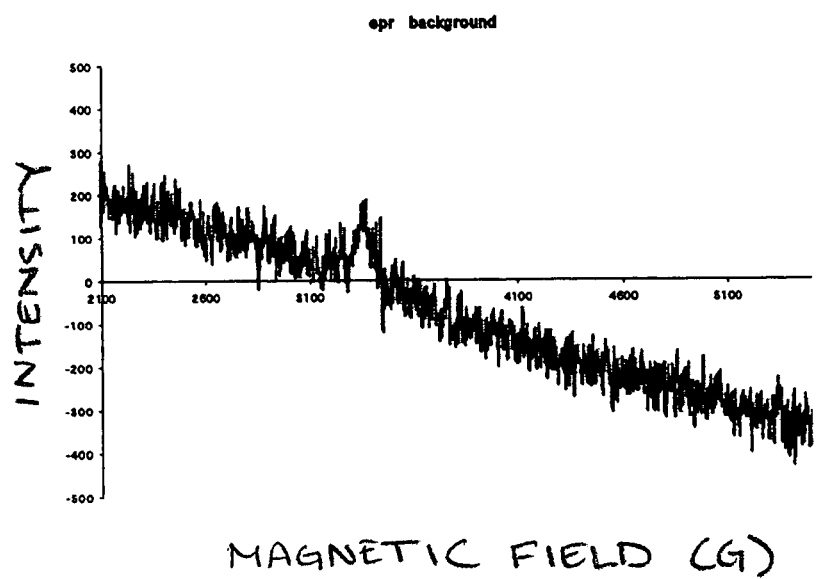
FIG. 11 shows an electron paramagnetic resonance spectrum of silicon nanocrystals synthesized according to an embodiment of the invention.

An electron paramagnetic resonance (EPR) spectrum of the particles formed in this example were also consistent with the presence of phosphorus. A strong signal was obtained for the particles that were formed during the co-reduction of silicon tetrachloride and phosphorus trichloride (see FIG. 10), whereas only a background signal was detected within the spectra taken from particles formed in Example 3 (see FIG. 11).

Figure 12:
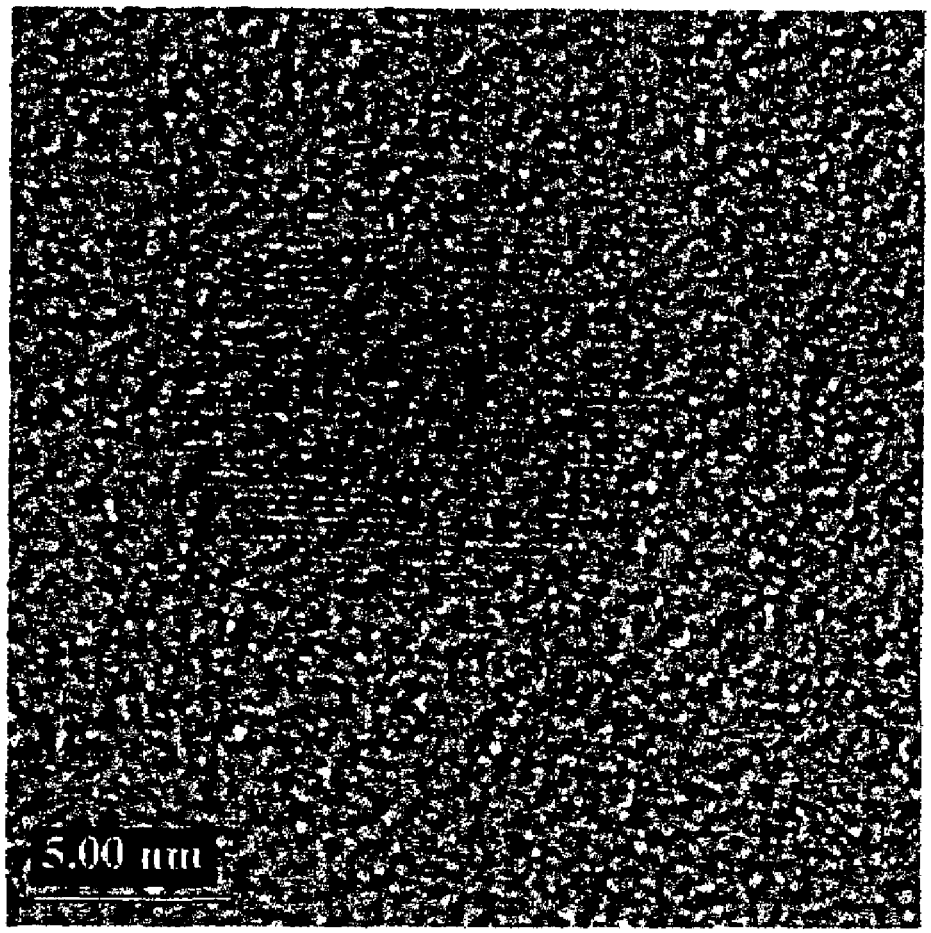
FIG. 12 shows a high resolution transmission electron microscope image of phosphorus doped silicon nanocrystals synthesized according to an embodiment of the invention.
Figure 13:
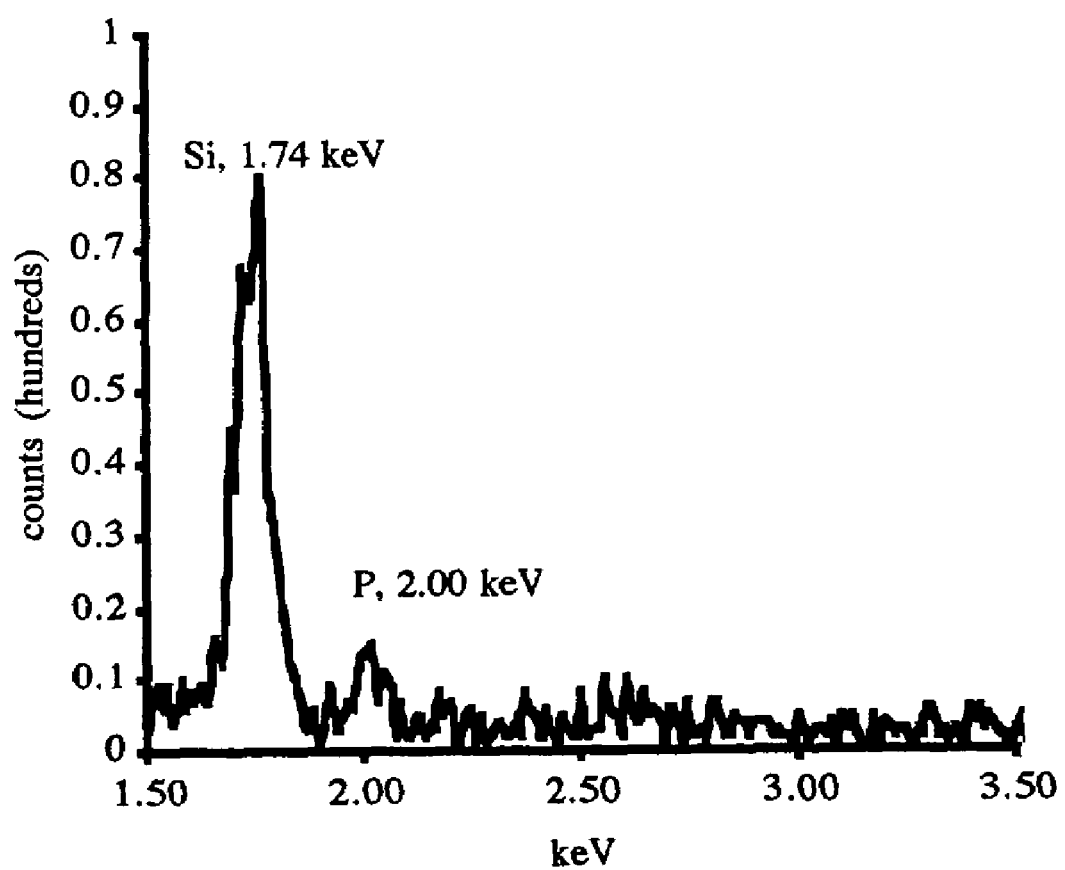
FIG. 13 shows an energy dispersive x-ray spectroscopy spectrum of a phosphorus doped silicon nanocrystal synthesized according to an embodiment of the invention.

A TEM sample was prepared by mixing a dilute hexane solution together with the particles formed in accordance with this example. A holey carbon grid was dipped into the mixture and subsequently dried in an oven at 110° C. High resolution TEM images of the particles (see FIG. 12) showed that the particles were crystalline (i.e., lattice fringes were present). The lattice fringes had a 3.1 Å lattice spacing, which is consistent with diamond crystalline silicon. The average size of these crystalline particles was between about 5 nm and 12 nm. Energy dispersive x-ray spectroscopy (EDX) confirmed that the particles on the grid included both silicon and phosphorus (see FIG. 13, silicon peak at 1.74 keV and phosphorus peak at 2.00 keV).

Example 7

A film formed of the P doped Si nanocrystalline particles (i.e., the particles formed using the method of Example 6) was grown by annealing a suspension of the particles on a p-type germanium wafer at 600° C. Specifically, one drop of a chloroform solution including the P doped Si nanocrystals was placed on a 5 mm square portion of a Ge wafer. The solution was allowed to air dry and was subsequently heated to 600° C. at 60° C. an hour under vacuum in a furnace. The furnace was maintained at 600° C. for 1 hour and was cooled to room temperature at a rate of 60° C. per hour. A black reflective film was observed on the surface of the Ge wafer. This film adhered poorly to the germanium wafer. It is believed that the poor adherence was due to the lattice mismatch between silicon and germanium or to contaminants present on the germanium wafer.

Example 8

Germanium nanocrystals were formed in a metathesis reaction using the following procedure. A solution of sodium naphalenide in 70 cm$^3$ of 1,2-dimethoxyethane (glyme) was prepared by stirring an excess of sodium with 3.94 grams of naphthalene in glyme overnight. This solution was added rapidly via cannula to 0.95 cm$^3$ of germanium tetrachloride (GeCl$_4$) in 250 cm$^3$ of glyme at near reflux. The solution changed from a clear solution to a black suspension. Immediately after the color change, 2.4 cm$^3$ of 2M BuMgCl in tetrahydrofuram was added to the suspension. The suspension was stirred overnight and upon settling, a dark solid in a deep red solution was observed. The solution was removed under vacuum and the solid was extracted with hexane and washed with water. After removal of hexane and heating under vacuum to remove the free naphthalene, 200 mg of viscous red oil was obtained. The nanoparticles (e.g., was within the red oil) were insoluable in both hexane and water, and appeared to be stable in ambient air and moisture conditions for at least one week.

Figure 14:
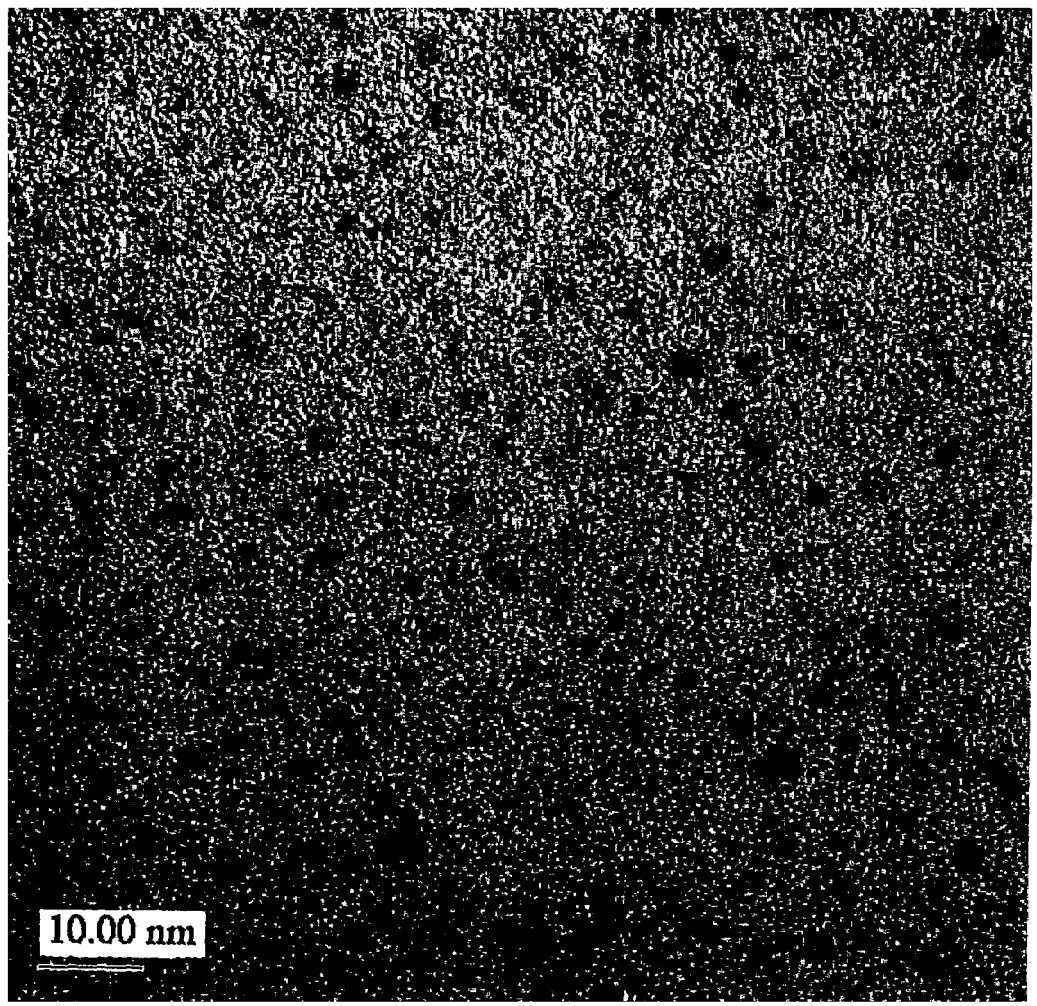
FIG. 14 shows a transmission electron microscope image of germanium nanocrystals synthesized according to an embodiment of the invention.
Figure 15:
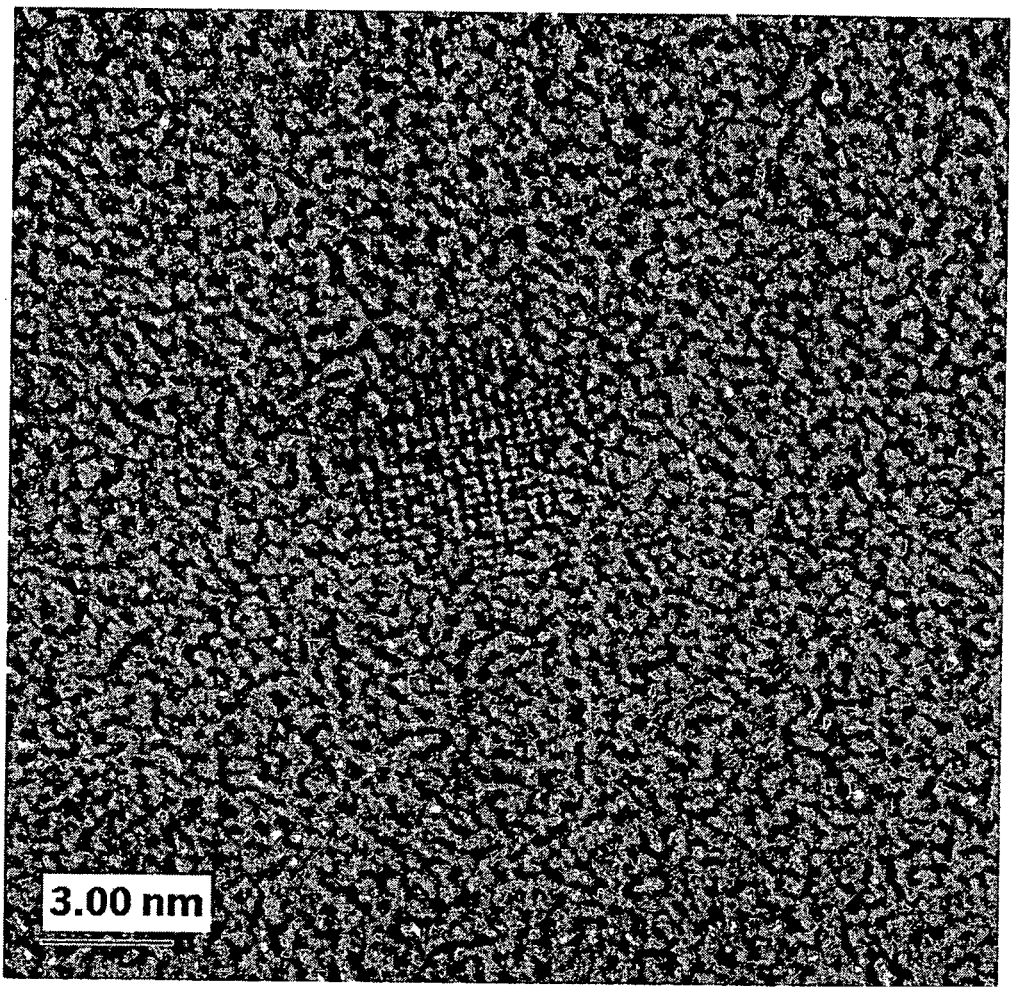
FIG. 15 shows a high resolution electron microscope image of a germanium nanocrystal synthesized according to an embodiment of the invention.

Bright field TEM images of the reaction product on a holey carbon grid (see FIG. 14) showed that the nanoparticles were circular (i.e., spherical particles). Each of the particles had a diameter of approximately 3 nm. The particles ranged in size from 2 to 7 nm with the bulk of the particles (about 80%) being between 3 to 5 nm. The TEM sample was prepared by mixing a dilute sonicated hexane solution of the powder and dipping the grid into the solution followed by drying the grid in an oven at 110° C. EDX confirmed that the particles of the grid were in fact germanium. High Resolution TEM images (see FIG. 15) showed that the particles were crystalline (i.e., lattice fringes were present).

Example 9

Germanium nanocrystals were formed by reducing GeCl$_4$ with finely divided magnesium. The finely divided Mg was produced by thermal decomposition of freshly prepared magnesium anthracenide formed in accordance with "Rate of Formation and Characterization of Magnesium Anthracene" by Bogdanovic, B., Sh.-T. Liao, R. Mynott, K. Schlichteu, and U. Westeppe in *Chem. Ber.* 117, 1378–1392 (1984). Thermal decomposition included heating the magnesium anthracenide from room temperature to 200° C. at 60° C./hour in a quartz boat under vacuum inside a tube furnace. After 12 hours at temperature, the active Mg was obtained as a fine black powder in the quartz boat while the anthracene sublimed out into a N$_2$(l) cooled trap. $^1$H NMR of a deuterated benzene extraction of the black powder showed only a very small amount of residual anthracene contamination.

To form the nanocrystals, 0.05 g (0.002 mol) of the finely divided Mg was added to a 3-neck flask fitted with a gas adaptor and septum inside a glove box. On a Schlenk line, 100 mL of dried and degassed diglyme was added to the finely divided Mg and stirred for 10 minutes giving a black suspension. To the suspension, 0.13 mL (1.097 mmol) of GeCl$_4$ was added at room temperature while being stirred. After thirty minutes, the color went from black to grey. After 24 hours, the color of the solution was brown. The solution was then stirred for a further 24 hours at room temperature to ensure that the reaction was complete. A solution of BuMgCl in tetrahydrofuran (0.55 ml of 2M BuMgCl in tetrahydrofuran, 1.1 mmol) was injected into the flask. A white precipitate was observed and the reaction mixture was allowed to stir overnight. The solvent from the mixture was removed in vacuuo. The mixture was extracted with 100 cm$^3$ of hexane and filtered through a celite loaded frit to remove residual salts. The mixture was then washed with acidified water.

Figure 16:
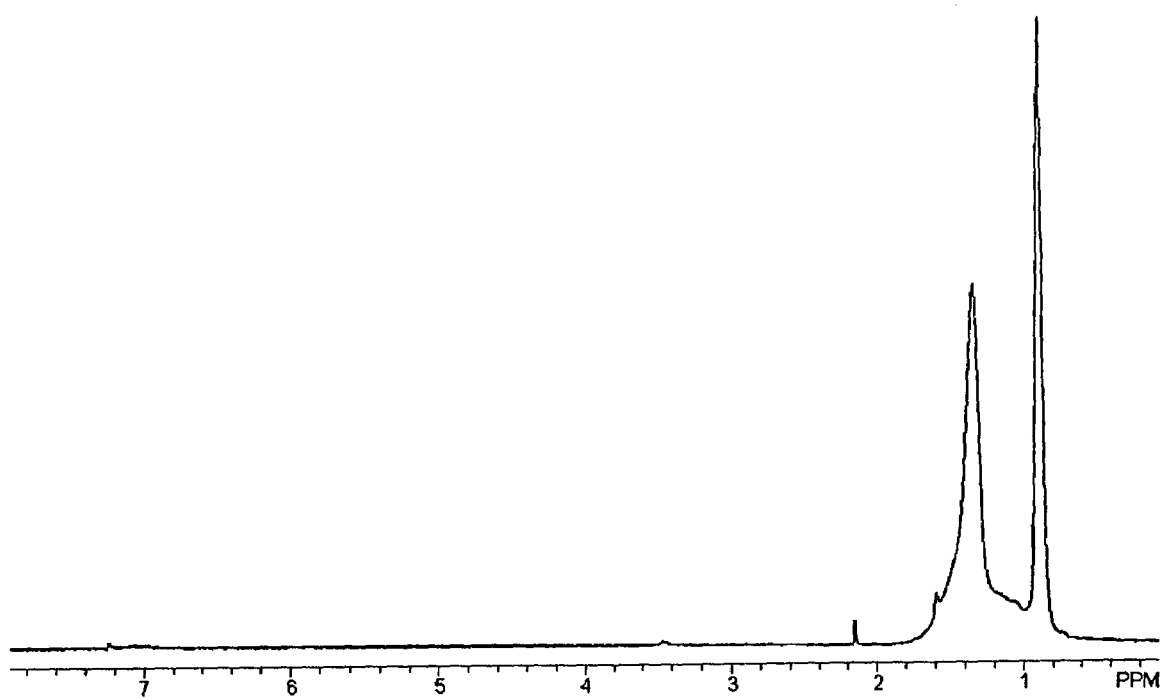
FIG. 16 shows a 1H NMR spectrum of germanium nanocrystals synthesized according to an embodiment of the invention.

The hexane layer was collected and the solvent was allowed to evaporate to give a dark yellow greasy solid. Solution $^1$H NMR of the reaction product (e.g., the particles in the yellow greasy solid) in CDCl$_3$ were consistent with the expected butyl termination (see FIG. 16). The $^1$H NMR contained two broad resonances, one at δ 1.34 ppm and one at δ 0.88 ppm corresponding to the CH$_2$ and CH$_3$ protons respectively, and supported by the 2:1 integrated ratio. It is believed that line broadening in this spectra was due to the limited motion of the surface butyl groups leading to a multitude of environments on an NMR timescale. The presence of surface butyl groups was supported by the presence of C—H vibrations at 2900 cm$^{-1}$ in a FTIR spectrum of the nanoparticles dispersed in a pressed KBr pellet.

Example 10

Germanium nanocrystals were formed by reducing GeCl$_4$ with magnesium by adding 0.05 g (0.002 mol) of finely divided Mg to a 3-neck flask fitted with a gas adaptor and septum inside a glove box. On a Schlenk line, 100 mL of dried and degassed diglyme was added to the finely divided Mg and stirred for 10 minutes giving a black suspension. The suspension was heated to 80° C. in an oil bath to which 0.13 mL (1.097 mmol) of GeCl$_4$ was added while being stirred. After thirty minutes, the color went from black to grey. After 60 minutes, the color of the solution was brown. The solution was then stirred for 24 hours at 80° C. After 24 hours of mixing at 80° C., all of the finely divided Mg was gone and the reaction mixture was cooled to room temperature. A solution of BuMgCl in tetrahydrofuran (0.55 ml of 2M BuMgCl in tetrahydrofuran, 1.1 mmol) was injected into the flask. A white precipitate was observed and the reaction mixture was allowed to stir overnight. The solvent from the mixture was removed in vacuuo. The mixture was extracted with 100 cm$^3$ of hexane and filtered through a celite loaded frit to remove residual salts. The mixture was then washed with acidified water. The hexane layer was collected and the solvent was allowed to evaporate to give a dark yellow greasy solid that included the reaction product (i.e., the nanocrystals).

Variations, modifications, and other implementations of what is described herein will occur to those of ordinary skill in the art without departing from the spirit and the scope of the invention. Accordingly, the invention is not to be limited only to the preceding illustrative descriptions.

What is claimed is:

1. A method for producing germanium nanocrystals comprising:
   contacting a germanium halide and a first reducing agent in a first organic solvent to produce a halide-terminated germanium nanocrystal; and
   contacting the halide-terminated germanium nanocrystal and a second reducing agent along with a preselected termination group in a second organic solvent to produce germanium nanocrystals terminated with the preselected termination group.

2. The method of claim 1 wherein the germanium halide has a chemical formula of $GeX_4$ where X is a halide.

3. The method of claim 1 wherein at least one of the first and second reducing agents is an elemental metal having an oxidation potential greater than 0.124 V.

4. The method of claim 3 wherein the elemental metal is in finely divided form.

5. The method of claim 3 wherein the elemental metal is selected from the group consisting of Li, Na, K, Rb, Cs, Mg, Ca, Zn and Al.

6. The method of claim 1 wherein at least one of the first and second reducing agents includes naphthalenide.

7. The method of claim 1 wherein at least one of the first and second reducing agents comprises a liquid alloy comprising one metal component that has an oxidation potential greater than 0.124 V.

8. The method of claim 7 wherein at least one of the first and the second reducing agents comprises an agent selected from the group consisting of a liquid alloy of Na/K, Hg/Na, Hg/K, Hg/Li, Hg/Zn, and Hg/Al.

9. The method of claim 1 wherein at least one of the first and second reducing agents comprises a mixture of an alkali metal and a phase transfer catalyst.

10. The method of claim 9 wherein the phase transfer catalyst is a crown ether.

11. The method of claim 1 wherein at least one of the first and the second reducing agents is selected from the group consisting of an aromatic anion, an alkyl metal compound, and a metal hydride of a metal selected from the group consisting of Li, Na, K, Mg, Ca, Zn and Al.

12. The method of claim 1 wherein at least one of the first and second reducing agents comprises an activated magnesium reagent.

13. The method of claim 1 wherein the first and the second reducing agents are the same.

14. The method of claim 1 wherein at least one of the first and second organic solvents comprises a polyether having a formula of $MeO(CH_2CH_2O)_nMe$.

15. The method of claim 14 wherein the polyether is selected from the group consisting of 1,2-dimethoxyethane (glyme), 2-methoxyethylether (diglyme), and triethyleneglycoldimethylether (triglyme).

16. The method of claim 1 wherein at least one of the first and second organic solvents is selected from the group consisting of tetrahydrofuran, 1,4-dioxane, benzene, toluene, and hexane.

17. The method of claim 1 wherein the first and second organic solvents are the same.

18. The method of claim 1 wherein the preselected termination group is selected from the group consisting of an alkyl termination group, a hydride termination group, an alkoxy termination group, an amino termination group, and mixtures thereof.

19. The method of claim 18 wherein the preselected termination group is an oligomeric or polymeric group.

20. The method of claim 1 wherein at least one of the steps of contacting a germanium halide and a first reducing agent in a first organic solvent and contacting the halide-terminated germanium nanocrystals and a second reducing agent along with a preselected termination group in a second organic solvent is carried out at ambient temperature and pressure.

21. The method of claim 1 wherein both of the steps of contacting a germanium halide and a first reducing agent in a first organic solvent and contacting the halide-terminated germanium nanocrystals and a second reducing agent along with a preselected termination group in a second organic solvent are carried out at ambient temperature and pressure.

22. The method of claim 1 wherein the steps of contacting a germanium halide and a first reducing agent in a first organic solvent and contacting the halide-terminated germanium nanocrystals and a second reducing agent along with a preselected termination group is carried out concurrently in one reaction.

23. The method of claim 1 wherein the second reducing agent provides the preselected termination group.

24. The method of claim 1 wherein the second reducing agent is a Grignard reagent and the preselected termination group is a butyl group.

25. A method for producing germanium nanocrystals comprising reducing a germanium halide with a reducing agent in an organic solvent at ambient temperature and pressure to produce halide-terminated nanocrystals.

26. The method of claim 25 wherein the germanium halide comprises germanium tetrachloride.

27. The method of claim 25 wherein the reducing agent comprises finely divided magnesium.

28. The method of claim 25 wherein the reducing agent includes naphalenide.

29. The method of claim 28 wherein the reducing agent comprises sodium naphalenide.

30. A method for producing phosphorus doped group IV nanocrystals, the method comprising:
   contacting a group IV halide and a phosphorus halide with a first reducing agent in a first organic solvent to produce a halide terminated phosphorus doped group IV nanocrystal, and
   contacting the halide terminated phosphorus doped group IV nanocrystal and a second reducing agent along with a preselected termination group in a second organic solvent to produce phosphorus doped group IV nanocrystals terminated with the preselected termination group.

31. The method of claim 30 wherein the group IV halide comprises a silicon halide.

32. The method of claim 31 wherein the silicon halide comprises silicon tetrachloride.

33. The method of claim 32 wherein the phosphorus halide comprises phosphorus trichloride.

34. The method of claim 30 wherein the preselected termination group comprises an octyl group.

35. The method of claim 30 wherein both of the steps of contacting a group IV halide and a phosphorus halide with a first reducing agent in a first organic solvent to produce a halide terminated phosphorus doped group IV nanocrystal and contacting the halide terminated phosphorus doped group IV nanocrystal and a second reducing agent along with a preselected termination group in a second organic solvent are carried out at a temperature of about 50° C. or less.

* * * * *